US009797953B2

(12) United States Patent
Hu et al.

(10) Patent No.: US 9,797,953 B2
(45) Date of Patent: Oct. 24, 2017

(54) SELF-TEST MODULE OF ELECTRONIC CIRCUIT BREAKER

(71) Applicants: SEARI ELECTRIC TECHNOLOGY CO., LTD., Shanghai (CN); ZHEJIANG CHINT ELECTRICS CO., LTD., Yueqing (CN)

(72) Inventors: Yinglong Hu, Shanghai (CN); Lijun Chen, Shanghai (CN); Xianjun Yi, Shanghai (CN)

(73) Assignees: SEARI ELECTRIC TECHNOLOGY CO., LTD., Shanghai (CN); ZHEJIANG CHINT ELECTRICS CO., LTD., Yueqing (CN)

( * ) Notice: Subject to any disclaimer, the term of this patent is extended or adjusted under 35 U.S.C. 154(b) by 0 days.

(21) Appl. No.: 15/034,674

(22) PCT Filed: Oct. 24, 2014

(86) PCT No.: PCT/CN2014/089370
§ 371 (c)(1),
(2) Date: May 5, 2016

(87) PCT Pub. No.: WO2015/067129
PCT Pub. Date: May 14, 2015

(65) Prior Publication Data
US 2016/0274190 A1    Sep. 22, 2016

(30) Foreign Application Priority Data

Nov. 8, 2013  (CN) .......................... 2013 1 0553519

(51) Int. Cl.
*G01R 31/02*   (2006.01)
*G01R 31/327*  (2006.01)
(Continued)

(52) U.S. Cl.
CPC ....... *G01R 31/3277* (2013.01); *G01R 31/327* (2013.01); *H02H 1/06* (2013.01); *H02H 3/044* (2013.01)

(58) Field of Classification Search
None
See application file for complete search history.

(56) References Cited

U.S. PATENT DOCUMENTS 3,532,967 A   10/1970 Milton et al.
4,105,965 A    8/1978 Russell
(Continued)

FOREIGN PATENT DOCUMENTS

CN   201075659 Y   6/2008
CN   201528215 U   7/2010
(Continued)

OTHER PUBLICATIONS

Office Action issued in Chinese Application No. 201310553519.8; dated Dec. 29, 2016 (6 pages).
(Continued)

*Primary Examiner* — Patrick Assouad
*Assistant Examiner* — Demetrius Pretlow
(74) *Attorney, Agent, or Firm* — Osha Liang LLP (57) ABSTRACT

A self-test module of an electronic circuit breaker includes a power supply assembly with a rechargeable battery, a self-test enablement assembly, an induced power supply assembly, a boost power supply, and a micro control unit (MCU). The self-test enablement assembly is connected to the rechargeable battery and includes an enablement button, a capacitor and a first power chip connected in series. The induced power supply assembly includes a buck chip. The boost power supply includes a second power chip and a boost chip connected in series. The MCU includes a plurality of pins that are connected to the first and second power (Continued)

chips, the buck chip, and the boost chip. The self-test module has two working modes; the electronic circuit breaker may be provided with or without a load current. The MCU operates the self-test procedure, indicates the self-test status, and maintains the indication for a period of time.

10 Claims, 4 Drawing Sheets

(51) Int. Cl.
*H02H 1/06* (2006.01)
*H02H 3/04* (2006.01)

(56) References Cited

U.S. PATENT DOCUMENTS

| | | | | |
|---|---|---|---|---|
| 4,814,712 A * | 3/1989 | Burton | ............... | H02H 3/044 324/424 |
| 6,426,634 B1 * | 7/2002 | Clunn | ............... | H02H 3/044 324/522 |
| 7,800,874 B2 * | 9/2010 | DiSalvo | ............... | H02H 3/335 361/42 |
| 7,852,606 B2 * | 12/2010 | Mernyk | ............... | H02H 3/335 361/42 |
| 8,035,936 B2 * | 10/2011 | Erger | ............... | H01H 71/123 361/42 |
| 2005/0002137 A1 * | 1/2005 | Germain | ............... | H01H 83/04 361/42 |
| 2008/0007879 A1 * | 1/2008 | Zaretsky | ............... | H02H 3/335 361/42 |
| 2010/0295568 A1 * | 11/2010 | Ostrovsky | ............... | G01R 31/3277 324/750.3 |
| 2013/0300423 A1 * | 11/2013 | Klapper | ............... | G01R 31/3272 324/424 |

FOREIGN PATENT DOCUMENTS

| | | |
|---|---|---|
| CN | 202362428 U | 8/2012 |
| CN | 202486285 U | 10/2012 |
| CN | 102968170 A | 3/2013 |
| CN | 202916621 U | 5/2013 |
| CN | 103777137 A | 5/2014 |
| CN | 203786556 U | 8/2014 |
| JP | S58201075 A | 11/1983 |

OTHER PUBLICATIONS

International Search Report issued in corresponding application No. PCT/CN2014/089370 dated Jan. 30, 2015 (6 pages).
Written Opinion of the International Searching Authority issued in corresponding application No. PCT/CN2014/089370 dated Jan. 30, 2015 (4 pages).
Wang, Shicheng et al., "Research of New Intelligent Controller for Permanent Magnetic Vacuum Circuit Breaker"; Low Voltage Apparatus, No. 18; Sep. 30, 2012; pp. 1-4 and 12 (5 pages).

* cited by examiner

SELF-TEST MODULE OF ELECTRONIC CIRCUIT BREAKER

BACKGROUND OF THE INVENTION

1. Field of the Invention

The present invention relates to electronic circuit breaker, more particularly, relates to a self-test module of electronic circuit breaker.

2. The Related Art

Low voltage circuit breaker is a kind of switching device which can not only connect and break normal load current and overload current, but also can connect and break short-circuit current. At present, low voltage circuit breaker has been widely used.

Reliable operations of the low voltage circuit breaker relates to people's life and property safety. In order to ensure the reliability of low voltage circuit breakers, thermo magnetic circuit breakers are provided with test buttons for testing the reliability of an action mechanism. With the construction of smart grids, the applications of electronic circuit breakers are popularized, more and more electronic circuit breakers appear in low voltage circuit breaker field. However, electronic circuit breakers are lack of functions for testing the completeness and reliability.

Existing thermal magnetic circuit breakers (non-electronic) are provided with test buttons for testing the reliability of the action mechanism. Existing electronic low voltage circuit breakers do not have a test function, or only have a tripping test function. A few products have a self-test function, but the self-test function requires external accessories. It is not convenient to carry or use the external accessories. The accessories and the circuit breakers cooperating with the accessories are expensive. Further, even with the external accessories, the self-test function or the detected information is not clear enough. It is still difficult and inconvenient to realize a test under non-working status such as manufacturing, installation or maintenance of the circuit breakers.

SUMMARY

The present invention discloses a self-test module of electronic circuit breaker which is convenient to use and comprehensive in function.

According to an embodiment of the present invention, a self-test module of electronic circuit breaker is provided. The self-test module comprises a power supply assembly, a self-test enablement assembly, an induced power supply assembly, a boost power supply and a micro control unit. The power supply assembly comprises a rechargeable battery. The self-test enablement assembly comprises an enablement button, a capacitor and a first power chip which are connected in series. The self-test enablement assembly is connected to the rechargeable battery. The induced power supply assembly comprises a buck chip. The boost power supply comprises a second power chip and a boost chip which are connected in series. The micro control unit provided with a plurality of pins which are connected to the first power chip, the second power chip, the buck chip and the boost chip respectively. When the electronic circuit breaker does not have a load current, when the enablement button is pressed, the MCU is powered by the rechargeable battery and operates a self-test procedure to check completeness of the components and obtain detection results, the MCU indicates the self-test status after operating the self-test procedure and maintains the indication for a period of time, then the rechargeable battery stops powering the MCU.

According to an embodiment, when the electronic circuit breaker is provided with a load current, the induced power supply assembly receives a DC signal generated by a current transformer from a load current, and the DC signal is used as the actuating signal of the flux convertor. The DC signal is stepped down by the buck chip and the bucked DC signal is used to power the MCU. The MCU detects an induced current, when the enablement button is pressed, the MCU detects the pressing and operates the self-test procedure, indicates the self status statues and maintains the indication for a period of time.

According to an embodiment, the electronic circuit breaker does not have a load current, when the electronic circuit breaker does not have a load current, the capacitor is charged to a potential equal to the rechargeable battery when the enablement button is pressed. When the enablement button is released, the capacitor discharges so that the first power chip may power the MCU. The MCU does not detect an induced current and maintains the first power chip to power the MCU for operating the self-test procedure, the MCU enables the second power chip. The second power chip outputs an enable signal to the boost chip, the boost chip outputs an actuating signal and steps up the actuating signal, the MCU monitors a voltage of the actuating signal and instructs the flux convertor to actuate when the actuating signal is stepped up to or exceed a threshold voltage of the flux convertor. The self-test procedure is finished and the MCU indicates the self-test status and maintains the indication for a period of time, then the first power chip stops powering the MCU.

According to an embodiment, the power supply output pin of the first power chip and the buck output pin of the buck chip are both connected to the power supply pin of the MCU for powering the MCU. The first enablement pin of the MCU is connected to the first power chip, if the first enablement pin outputs a high level signal, the first power chip powers the MCU. If the first enablement pin outputs a low level signal, the first power chip stops powering the MCU. The second enablement pin of the MCU is connected to the second power chip, if the second enablement pin outputs a high level signal, the second power chip is enabled and powers the boost chip to enable. If the second enablement pin outputs a low level signal, the second power chip is disabled and disables the boost chip. The first monitoring pin of the MCU is connected to the input pin of the induced power supply assembly for monitoring the induced current. The button monitoring pin of the MCU is connected the enablement button for monitoring whether the enablement button is pressed or not.

According to an embodiment, the output of the boost chip is provided as the actuating signal of the flux convertor, the actuating signal is connected to the second monitoring pin of the MCU.

According to an embodiment, the input pin of the induced power supply assembly receives a DC signal generated by a current transformer from a load current, the DC signal is used as the actuating signal of a flux convertor. The input pin is also connected to the input pin of the buck chip, the buck output pin of the buck chip is connected to the power supply pin of the MCU. The buck output pin of the buck chip is also connected to the rechargeable battery for charging the rechargeable battery.

According to an embodiment, the power supply assembly, the self-test enablement assembly, the induced power supply assembly, the boost power supply and the micro control unit are mounted on a circuit board and are accommodated in a housing, the circuit board is positioned at the bottom of the housing, the housing packages the components. A connector is provided at the bottom of the housing, the connector is electrically connected to the circuit board and the components mounted on the circuit board. The enablement button extends upwards and exceeds the top of the housing.

According to an embodiment, the self-test module is mounted on an electronic release of the electronic circuit breaker. The electronic release is provided with a slot on its housing. The slot matches with the housing of the self-test module, a connection slot is provided at the bottom of the slot, the position and shape of the connection slot match with the connector. The connector is plugged into the connection slot and the components of the self-test module are electrically connected with the electronic release.

According to an embodiment, the electronic release comprises a screen, an indicator light and a navigation keyboard, the self-test status are indicated by the screen and the indicator light.

According to an embodiment, the self-test module is pluggable.

The self-test module of electronic circuit breaker of the present invention is pluggable. The self-test module may be conveniently plugged onto an electronic release. Under non-working status such as manufacturing, installation or maintenance of the electronic circuit breakers, a test of function completeness and reliability of the products may be automatically operated and test results will be provided by pressing a test button on the electronic release, without an extra external accessory.

BRIEF DESCRIPTION OF THE DRAWINGS

The above and other features, natures, and advantages of the invention will be apparent by the following description of the embodiments incorporating the drawings, wherein.

DETAILED DESCRIPTION OF EMBODIMENTS

Figure 1:
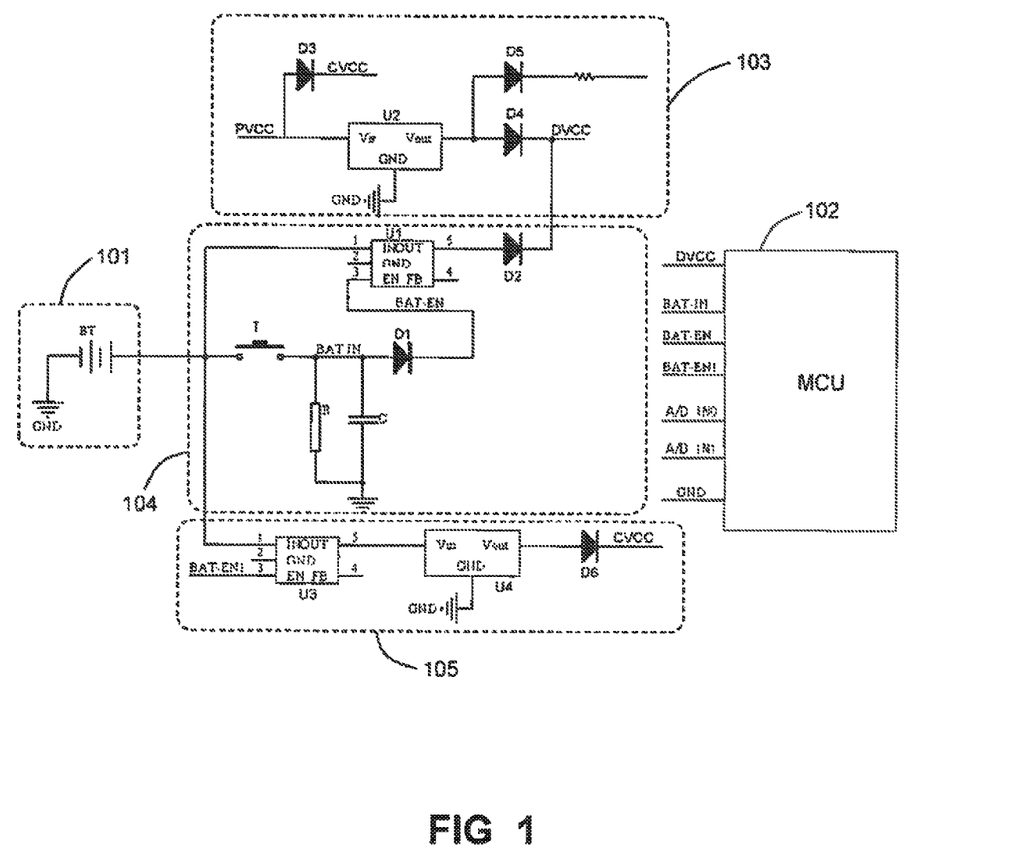
FIG. 1 illustrates a schematic circuit diagram of a self-test module of electronic circuit breaker according to an embodiment of the present invention.

Referring to FIG. 1, FIG. 1 illustrates a schematic circuit diagram of a self-test module of electronic circuit breaker according to an embodiment of the present invention. The self-test module of electronic circuit breaker comprises a power supply assembly 101, a self-test enablement assembly 104, an induced power supply assembly 103, a boost power supply 105 and a micro control unit (MCU) 102.

The power supply assembly 102 comprises a rechargeable battery BT. One end of the rechargeable battery BT is connected to ground GND.

The self-test enablement assembly 104 comprises an enablement button T, a capacitor C and a first power chip U1 which are connected in series. The self-test enablement assembly 104 is connected to the rechargeable battery BT. According to the embodiment shown in FIG. 1, a resistor R is connected in parallel with the capacitor C, and a diode D1 is provided between the capacitor C and the first power chip U1. A button monitoring pin BAT-IN of the MCU 102 is drawn from a point between the enablement button T and the diode D1. The button monitoring pin BAT-IN monitors whether the enablement button T is pressed or not. An input terminal IN of the first power chip U1 is connected to the rechargeable battery BT and is powered by the rechargeable battery BT. An enablement terminal EN of the first power chip U1 is connected to a first enablement pin BAT-EN of the MCU. The first enablement pin BAT-EN controls the working status of the first power chip U1. An output terminal OUT of the first power chip U1 is connected to a power supply pin DVCC of the MCU via a second diode D2.

The induced power supply assembly 103 comprises a buck chip U2. According to the embodiment shown in FIG. 1, an input terminal PVCC of the induced power supply assembly 103 receives a direct current (DC) signal generated by a current transformer from a load current. The DC signal is used as an actuating signal CVCC of a flux convertor. According to the embodiment shown in FIG. 1, a third diode D3 is provided between PVCC and CVCC. An input terminal Vin of the buck chip U2 is connected to PVCC. The buck chip U2 steps down the DC signal input from PVCC. An output terminal Vout of the buck chip U2 is connected to the power supply pin DVCC of the MCU. According to the embodiment shown in FIG. 1, a fourth diode D4 is provided between the output terminal Vout of the buck chip U2 and the power supply pin DVCC of the MCU. The buck chip U2 steps down the DC signal and powers the MCU with the processed DC signal. The buck output pin, which is the output terminal Vout of the buck chip U2, is also connected to the rechargeable battery BT and charges the rechargeable battery BT. According to the embodiment shown in FIG. 1, a fifth diode D5 is provided between the output terminal Vout and the rechargeable battery BT.

The boost power supply 105 comprises a second power chip U3 and a boost chip U4 which are connected in series. An input terminal IN of the second power chip U3 is connected to the rechargeable battery BT and is powered by the rechargeable battery BT. An enablement terminal EN of the second power chip U3 is connected to a second enablement pin BAT-EN1 of the MCU. The second enablement pin BAT-EN1 controls the working status of the second power chip U3. An output terminal OUT of the second power chip U3 is connected to an input terminal Vin of the boost chip U4. The boost chip U4 steps up the output of the second power chip U2. The signal of the output terminal Vout of the boost chip U4 is used as the actuating signal CVCC of the flux convertor. According to the embodiment shown in FIG. 1, a sixth diode D6 is provided between the output terminal Vout of the boost chip U4 and CVCC. A second monitoring pin A/D IN1 of the MCU is connected to CVCC. The second monitoring pin A/D IN1 monitors the boost condition of CVCC and controls the flux convertor to actuate when CVCC steps up to a threshold voltage.

The micro control unit (MCU) 102 is provided with a plurality of pins which are connected to the first power chip U1, the second power chip U3, the buck chip U2 and the boost chip U4, respectively. According to the embodiment shown in FIG. 1, the pins of the MCU 102 and their connections are as follows:

The power supply output pin of the first power chip and the buck output pin of the buck chip are both connected to the power supply pin DVCC of the MCU for powering the MCU.

The first enablement pin BAT-EN of the MCU is connected to the first power chip. If the first enablement pin BAT-EN outputs a high level signal, the first power chip powers the MCU. If the first enablement pin BAT-EN outputs a low level signal, the first power chip stops powering the MCU.

The second enablement pin BAT-EN1 of the MCU is connected to the second power chip. If the second enablement pin BAT-EN1 outputs a high level signal, the second power chip is enabled and powers the boost chip to enable. If the second enablement pin BAT-EN outputs a low level signal, the second power chip is disabled and the boost chip is disabled.

The first monitoring pin A/D IN0 of the MCU is connected to the input pin PVCC of the induced power supply assembly for monitoring the induced current.

The button monitoring pin BAT-IN of the MCU is connected the enablement button T for monitoring whether the enablement button T is pressed or not.

The electronic circuit breaker has two statuses: a non-working status and a working status. Under the non-working status, the electronic circuit breaker does not have as load current. Under the working status, the electronic circuit breaker is provided with a load current.

A working process under the non-working status is as follows: the electronic circuit breaker does not have a load current. When the enablement button is pressed, the MCU is powered by the rechargeable battery and operates a self-test procedure to check completeness of the components and obtain detection results. The MCU indicates the self-test status after operating the self-test procedure and maintains the indication for a period of time. Then the rechargeable battery stops powering the MCU. More particularly, when the electronic circuit breaker does not have a load current, the capacitor is charged to a potential that is equal to the rechargeable battery when the enablement button is pressed. When the enablement button is released, the capacitor discharges so that the first power chip may power the MCU. The MCU does not detect an induced current and maintains the first power chip to power the MCU for operating the self-test procedure. The MCU enables the second power chip, the second power chip outputs an enable signal to the boost chip, the boost chip outputs an actuating signal and steps up the actuating signal. The MCU monitors a voltage of the actuating signal and instructs the flux convertor to actuate when the actuating signal is stepped up to or exceed a threshold voltage of the flux convertor. The self-test procedure is finished and the MCU indicates the self-test status and maintains the indication for a period of time. Then the first power chip stops powering the MCU.

A working process under the working status is as follows: when the electronic circuit breaker is provided with a load current, the induced power supply assembly receives a direct current (DC) signal generated by a current transformer from a load current, and the DC signal is used as the actuating signal of the flux convertor. The DC signal is stepped down by the buck chip and the bucked DC signal is used to power the MCU. The MCU detects an induced current, when the enablement button is pressed, the MCU detects the pressing and operates the self-test procedure, indicates the self-status statues and maintains the indication for a period of time.

Considering the embodiment shown in FIG. 1, according to this embodiment, the working process is as follows:

When the electronic circuit breaker is under the non-working status, that is, the electronic circuit breaker does not have a load current, the capacitor C is quickly charged to a potential equal to the rechargeable battery BT for energy storage when the enablement button T of the self-test enablement assembly 104 is pressed. When the enablement button T is released, the capacitor C begins to discharge and the enablement terminal EN of the first power chip U1 receives a high level signal. The first power chip U1 is enabled and the output terminal OUT powers the MCU 102 via the power supply terminal DVCC of the MCU 102. The MCU enables. The first monitoring pin A/D IN0 of the MCU does not detect an input signal from the induced power supply assembly 103, so the MCU determines that the electronic circuit breaker is under non-working status. The first enablement pin BAT-EN of the MCU outputs a high level signal to the first power chip U1 to maintain the power supply. The MCU operates the self-test procedure and performs a simulated tripping test. The MCU outputs a high level signal via the second enablement pin BAT-EN1, the enablement terminal EN of the second power chip U3 in the boost power supply 105 receives the high level signal from the second enablement terminal BAT-EN1, the second power chip U3 is enabled. The output terminal OUT of the second power chip U3 outputs a signal to the boost chip U4, the boost chip steps up the signal and outputs the boosted signal. The boost chip U4 shall steps up the low voltage signal outputted by the second power chip to a voltage over the threshold voltage for actuating the flux convertor of the electronic circuit breaker Then the boosted signal may be used as the actuating signal of the flux convertor. The second monitoring pin A/D IN1 of the MCU monitors the voltage of the signal outputted by the boost chip U4. When the signal is boosted to the required voltage, the MCU outputs a low level signal via the second enablement pin BAT-EN1 to stop the second power chip U3 and the boost chip U4 in sequence, the boost procedure then stops. The MCU generates an actuating instruction to the flux convertor to actuate the electronic circuit breaker. The self-test procedure is finished and the MCU indicates the self-test status and maintains the indication for a period of time. Then the first enablement pin BAT-EN of the MCU outputs a low level signal, the first power chip U1 stops outputting and the MCU is stopped.

When the electronic circuit breaker is under the working status, that is, the electronic circuit breaker is provided with a load current. The input terminal PVCC of the induced power supply assembly 103 receives a direct current (DC) signal, the DC signal is generated by a current transformer from a load current and processed by a power supply circuit. The DC signal can be directly used as the actuating signal of the flux convertor of the electronic circuit breaker. The DC signal is stepped down by the buck chip U2, the output of the buck chip U2 is divided into two ways. One way is provided to the power supply pin DVCC of the MCU, the other way is connected to the rechargeable battery BT for charging the rechargeable battery. When the electronic circuit breaker is under the working status, the first monitoring pin A/D IN0 of the MCU 102 detects an input signal from the induced power supply assembly 103, so the MCU determines that the power supply pin DVCC is powered by the induced current of the load current rather than by the rechargeable battery BT. When the enablement button T of the self-test enablement assembly 104 is pressed, the MCU detects the pressing of the enablement button T via the button monitoring pin BAT-IN. The MCU operates the self test procedure, indicates the self-status statues and maintains the indication for a period of time.

Figure 2:
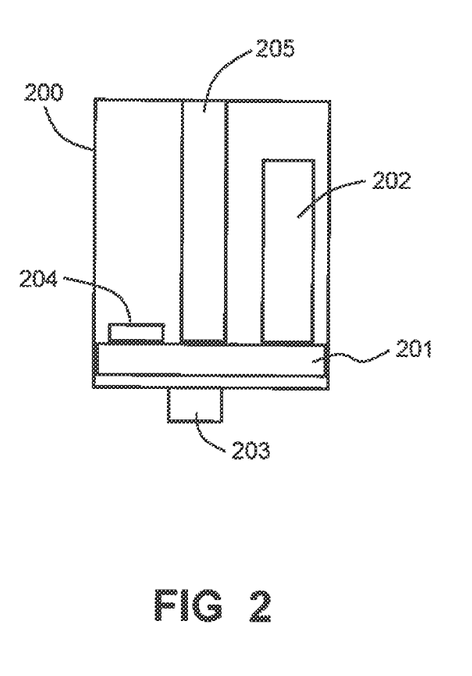
FIG. 2 illustrates a schematic structural diagram of a self-test module of electronic circuit breaker according to an embodiment of the present invention.

According to FIG. 2, FIG. 2 illustrates a schematic structural diagram of as self-test module of electronic circuit breaker according to an embodiment of the present invention. The self-test module is designed to be pluggable, all of the components of the module are accommodated in a housing 200. The power supply assembly, the self-test enablement assembly, the induced power supply assembly, the boost power supply and the micro control unit, which are marked together as 204, are mounted on a circuit board 201. The above components and the circuit board 201 are accommodated in a housing 200. The circuit board 201 is positioned at the bottom of the housing 200, the housing 200 packages the components. The rechargeable battery 202 with a relatively large volume will occupy a relatively large space within the housing. The enablement button 205 extends upwards and exceeds the top of the housing 200, so that it is convenient to operate the enablement button 205. A connector 203 is provided at the bottom of the housing 200, the connector 203 is electrically connected to the circuit board 201 and the components mounted on the circuit board 201.

Figure 3:
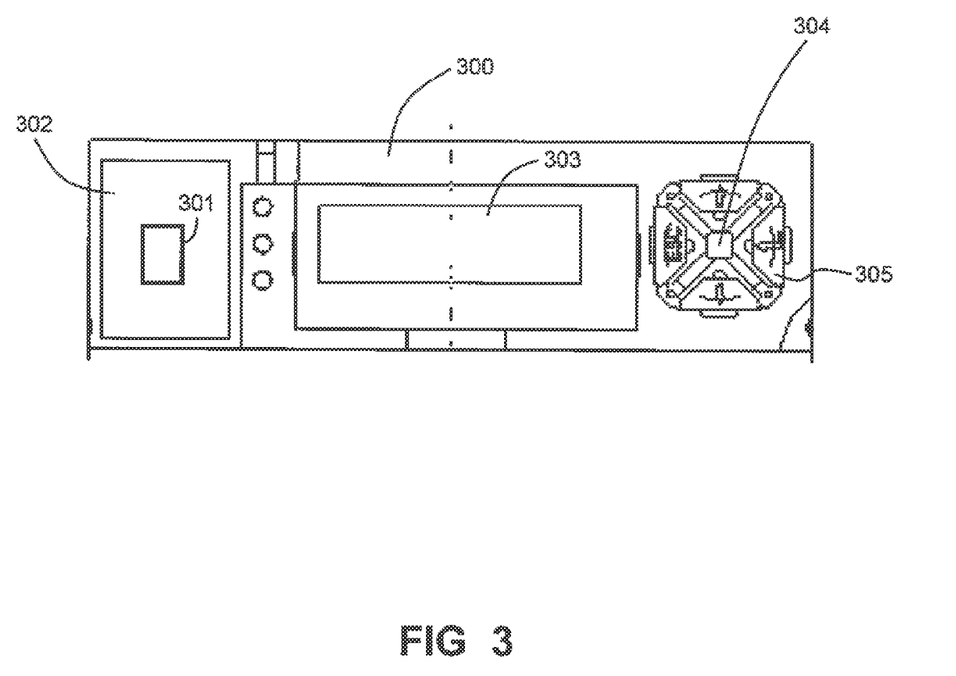
FIG. 3 illustrates a schematic structural diagram of an electronic release of a self-test module of electronic circuit breaker according to an embodiment of the present invention.

The self-test module of electronic circuit breaker of the present invention is mounted on an electronic release of the electronic circuit breaker. FIG. 3 illustrates a schematic structural diagram of an electronic release of a self-test module of electronic circuit breaker according to an embodiment of the present invention. According to FIG. 3, the electronic release comprises an intelligent controller 300. A slot 302 is provided on a housing of the electronic release, the slot 302 matches with the housing 200 of the self-test module. A connection slot 301 is provided at the bottom of the slot 302. The position and shape of the connection slot 301 match with the connector 203. The connector 203 is plugged into the connection slot 301. The components of the self-test module are then electrically connected with the electronic release. According to FIG. 3, the electronic release further comprises a screen 303, an indicator light 304 and a navigation keyboard 305. The MCU utilizes the screen 303 and the indicator light 304 to indicate the self-test status after operating the self-test procedure. The screen 303 displays associated parameters while the indicator light 304 indicates a corresponding status. The navigation keyboard 305 is used to receive necessary operations.

Figure 4:
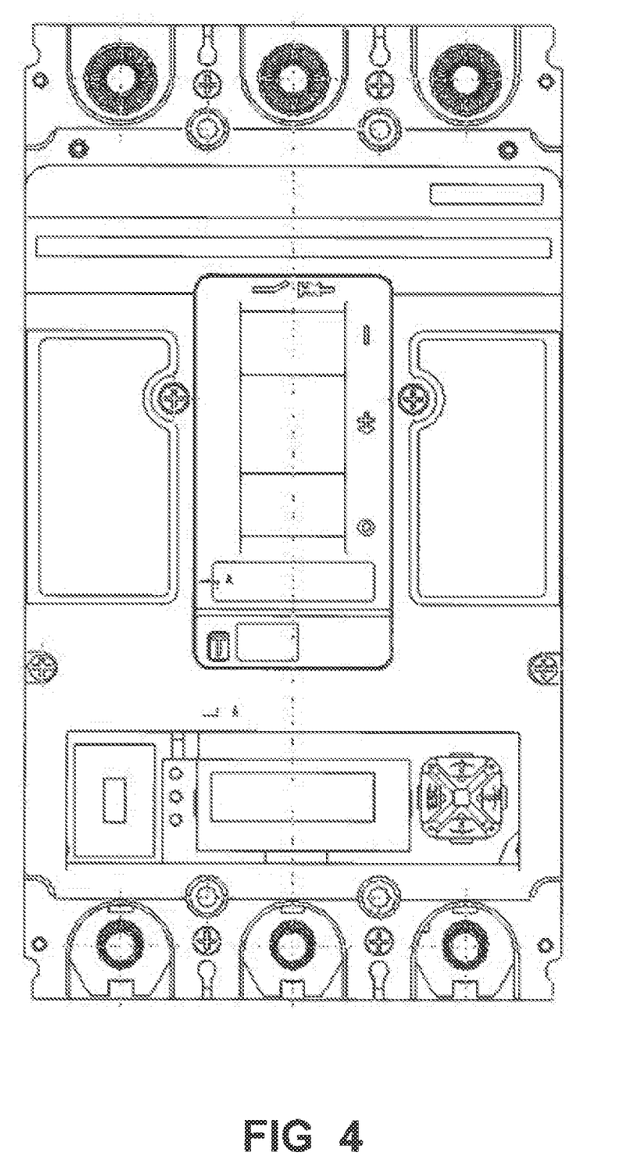
FIG. 4 illustrates a schematic structural diagram of an electronic circuit equipped with a self-test module of the present invention.

FIG. 4 illustrates a schematic structural diagram of an electronic circuit equipped with a self-test module of the present invention.

The self-test module of electronic circuit breaker of the present invention is pluggable. The self-test module may be conveniently plugged onto an electronic release. Under non-working status such as manufacturing, installation or maintenance of the electronic circuit breakers, a test of function completeness and reliability of the products may be automatically operated and test results will be provided by pressing a test button on the electronic release, without an extra external accessory.

The above embodiments are provided to those skilled in the art to realize or use the invention, under the condition that various modifications or changes being made by those skilled the art without departing the spirit and principle of the invention, the above embodiments may be modified and changed variously, therefore the protection scope of the invention is not limited by the above embodiments, rather, it should conform to the maximum scope of the innovative features mentioned in the Claims.

What is claimed is:

1. A self-test module of an electronic circuit breaker, comprising:
   a power supply assembly comprising a rechargeable battery;
   a self-test enablement assembly comprising an enablement button, a capacitor and a first power chip which are connected in series, wherein the self-test enablement assembly is connected to the rechargeable battery;
   an induced power supply assembly comprising a buck chip;
   a boost power supply comprising a second power chip and a boost chip which are connected in series;
   a micro control unit (MCU) provided with a plurality of pins which are connected to the first power chip, the second power chip, the buck chip and the boost chip, respectively;
   wherein, when the electronic circuit breaker does not have a load current, when the enablement button is pressed, the MCU is powered by the rechargeable battery and operates a self-test procedure to check completeness of the components and obtain detection results, the MCU indicates the self-test status after operating the self-test procedure and maintains the indication for a period of time, then the rechargeable battery stops powering the MCU.

2. The self-test module of an electronic circuit breaker according to claim 1, wherein
   when the electronic circuit breaker is provided with a load current, the induced power supply assembly receives a DC signal generated by a current transformer from a load current, and the DC signal is used as the actuating signal of the flux convertor, the DC signal is stepped down by the buck chip and the bucked DC signal is used to power the MCU, the MCU detects an induced current, when the enablement button is pressed, the MCU detects the pressing and operates the self-test procedure, indicates the self-status statues and maintains the indication for a period of time.

3. The self-test module of an electronic circuit breaker according to claim 2, wherein
   when the electronic circuit breaker does not have a load current, the capacitor is charged to a potential equal to the rechargeable battery when the enablement button is pressed, when the enablement button is released, the capacitor discharges so that the first power chip powers the MCU, the MCU does not detect an induced current and maintains the first power chip to power the MCU for operating the self-test procedure, the MCU enables the second power chip, the second power chip outputs an enable signal to the boost chip, the boost chip outputs an actuating signal and steps up the actuating signal, the MCU monitors a voltage of the actuating signal, and disables the boost chip and instructs the flux convertor to actuate when the actuating signal is stepped up to or exceed a threshold voltage of the flux convertor, the self-test procedure is finished and the MCU indicates the self-test status and maintains the indication for a period of time, then the first power chip stops powering the MCU.

4. The self-test module of an electronic circuit breaker according to claim 3, wherein
   the power supply output pin of the first power chip and the buck output pin of the buck chip are both connected to the power supply pin (DVCC) of the MCU for powering the MCU;

the first enablement pin (BAT-EN) of the MCU is connected to the first power chip, if the first enablement pin (BAT-EN) outputs a high level signal, the first power chip powers the MCU; if the first enablement pin (BAT-EN) outputs a low level signal, the first power chip stops powering the MCU;

the second enablement pin (BAT-EN1) of the MCU is connected to the second power chip, if the second enablement pin (BAT-EN1) outputs a high level signal, the second power chip is enabled and powers the boost chip to enable; if the second enablement pin (BAT-EN1) outputs a low level signal, the second power chip is disabled and the boost chip is disabled;

the first monitoring pin (A/D IN0) of the MCU is connected to the input pin (PVCC) of the induced power supply assembly for monitoring the induced current;

the button monitoring pin (BAT-IN) of the MCU is connected to the enablement button (T) for monitoring whether the enablement button (T) is pressed or not.

5. The self-test module of an electronic circuit breaker according to claim 4, wherein
the output of the boost chip is provided as the actuating signal (CVCC) of the flux convertor, the actuating signal (CVCC) is connected to the second monitoring pin (A/D IN1) of the MCU.

6. The self-test module of an electronic circuit breaker according to claim 4, wherein
the input pin (PVCC) of the induced power supply assembly receives a DC signal generated by a current transformer from a load current, the DC signal is used as the actuating signal (CVCC) of a flux convertor;
the input pin (PVCC) is also connected to the input pin of the buck chip, the buck output pin of the buck chip is connected to the power supply pin (DVCC) of the MCU;
the buck output pin of the buck chip is also connected to the rechargeable battery for charging the rechargeable battery.

7. The self-test module of an electronic circuit breaker according to claim 1, wherein
the power supply assembly, the self-test enablement assembly, the induced power supply assembly, the boost power supply and the micro control unit are mounted on a circuit board and are accommodated in a housing, the circuit board is positioned at the bottom of the housing, the housing packages the components;
a connector is provided at the bottom of the housing, the connector is electrically connected to the circuit board and the components mounted on the circuit board;
the enablement button extends upwards and exceeds the top of the housing.

8. The self-test module of an electronic circuit breaker according to claim 7, wherein
the self-test module is mounted on an electronic release of the electronic circuit breaker, the electronic release is provided with a slot on its housing, the slot matches with the housing of the self-test module, a connection slot is provided at the bottom of the slot, the position and shape of the connection slot match with the connector, the connector is plugged into the connection slot and the components of the self-test module are electrically connected with the electronic release.

9. The self-test module of an electronic circuit breaker according to claim 8, wherein
the electronic release comprises a screen, an indicator light and a navigation keyboard, the self-test status are indicated by the screen and the indicator light.

10. The self-test module of an electronic circuit breaker according to claim 9, wherein
the self-test module is pluggable.

* * * * *